United States Patent [19]
Kikukawa et al.

[11] Patent Number: 5,835,424
[45] Date of Patent: Nov. 10, 1998

[54] SEMICONDUCTOR MEMORY

[75] Inventors: Hirohito Kikukawa; Masashi Agata; Hironori Akamatsu, all of Osaka, Japan

[73] Assignee: Matsushita Electric Industrial Co., Ltd., Osaka, Japan

[21] Appl. No.: 833,754

[22] Filed: Apr. 9, 1997

Related U.S. Application Data

[62] Division of Ser. No. 521,651, Aug. 31, 1995.

[30] Foreign Application Priority Data

Sep. 9, 1994 [JP] Japan .................................. 6-215437

[51] Int. Cl.$^6$ ...................................................... G11C 7/00
[52] U.S. Cl ...................... 365/200; 365/230.03; 365/233
[58] Field of Search ............................. 365/200, 230.03, 365/233, 230.04

[56] References Cited

U.S. PATENT DOCUMENTS 5,307,316  4/1994  Takemae .................................. 365/200
5,357,473  10/1994  Mizuno et al. ......................... 365/200

Primary Examiner—Vu A. Le
Attorney, Agent, or Firm—McDermott, Will & Emery

[57] ABSTRACT

In a synchronous DRAM, a redundancy judging circuit has a frequency dividing circuit and a plurality of judging circuits each having two address comparing circuits and one output circuit. When an internal CAS signal having an activating period of time according to a data burst length, is activated, the frequency dividing circuit divides the frequency of an internal continuous clock signal having the same time period of one cycle and the same phase as those of an external clock signal, and generates complementary clock signals each having a time period of one cycle twice the time period of one cycle of the internal continuous clock signal. A pair of address comparing circuits to which supplied is an internal column address to be successively updated according to the data burst length, alternately supply a redundancy judgement signal after alternately comparing the same defective column address previously programmed therein, with an internal column address according to the complementary clock signals supplied from the frequency dividing circuit. The output circuit supplies a redundancy judgement signal when either of the judgement signals is obtained. Thus, there is made an accurate column redundancy judgement at the time when the external clock signal is high in frequency.

11 Claims, 13 Drawing Sheets

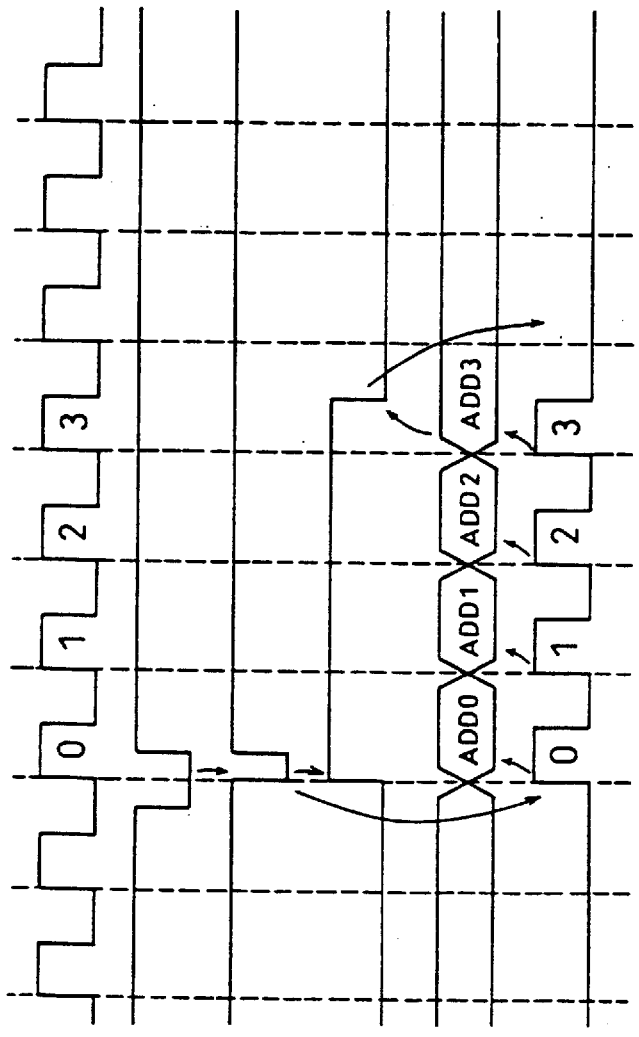

SEMICONDUCTOR MEMORY

This is a divisional of application Ser. No. 08/521,651, filed Aug. 31, 1995.

BACKGROUND OF THE INVENTION

The present invention relates to a semiconductor memory of the type arranged to continuously receive and supply data in synchronism with an external clock signal.

To adapt to recent improvements of a microprocessor (MPU) in operating frequency, it has been required to increase the speed of access to a dynamic random access memory (DRAM) used as a main memory. To satisfy such a demand, there is proposed a synchronous DRAM using a conventional universal DRAM as a core and additionally having an interface circuit such that data can be entered and supplied at high speed in synchronism with an external clock signal.

The paper by Y. Takai et al: "250Mbyte/sec Synchronous DRAM Using a 3-Stage-Pipelined Architecture" (1993 Symposium on VLSI Circuits, Digest of Technical Papers, pp. 59–60), discloses a synchronous DRAM using an arrangement in which a plurality of circuit blocks are operated in a pipeline manner in synchronism with an internal clock signal generated from a continuous external clock signal such that the internal clock signal has pulses in number equal to a data burst length. In this synchronous DRAM, internal column addresses corresponding to the data burst length are automatically generated in synchronism with the external clock signal.

Further, the paper by Y. Choi et al: "16Mbit Synchronous DRAM with 125Mbyte/sec Data Rate" (1993 Symposium on VLSI Circuits, Digest of Technical Papers, pp. 65–66). discloses a synchronous DRAM using an arrangement in which a continuous external clock signal is distributed to a plurality of circuit blocks to be operated and in which there is also distributed, to the circuit blocks, a mask signal representing a data burst length for making a portion of the continuous external clock signal effective.

A synchronous DRAM uses a universal DRAM as the core. Accordingly, to achieve a high yield, a localized defect of a memory bank must be relieved by using a redundant circuit. The paper by R. P. Cenker et al: "A Fault-Tolerant 64K Dynamic RAM" (1979 ISSCC, Digest of Technical Papers, pp. 150–151), discloses the following arrangement as an address comparing circuit for making a redundancy judgement in a conventional universal DRAM. The address comparing circuit has a charging transistor interposed between a power source node and a judging node, and an address comparing unit interposed between the judging node and a grounding node. The charging transistor is arranged to be activated and conducted by a given activating signal such that the judging node is charged to the "H" level. The address comparing unit has series circuits of (i) a plurality of fuse elements made of polysilicon or the like to be disconnected by laser according to a defective address to be programmed, and (ii) a plurality of transistors to be conducted according to an address which is successively updated and with which a memory bank is to be accessed, these series circuits being interposed between the judging node and the grounding node. When a given address is not identical with the programmed defective address, the charging transistor operates to bring the judging node to the "H" level. When both addresses become identical with each other, an electric current path is formed from the judging node to the grounding node to bring the judging node to the "L" level. To restrain the through-current from the power source node to the grounding node in the latter case, it is required to select small-size transistors for the charging transistor and for the transistors of the address comparing unit.

As shown in the paper by Y. Takai et al, when a column address counter for generating internal column addresses corresponding to the data burst length is disposed independently from the circuit for generating an internal clock signal having pulses in number equal to the data burst length, the data burst length is counted twice, resulting in an increase in power consumption of the synchronous DRAM.

As shown in the paper by Y. Choi et al, when a continuous external clock signal and a mask signal representing the data burst length are distributed to each of the circuit blocks, a masking operation is executed in each of the circuit blocks to provoke an increase in power consumption and the load capacitance of the clock signal line is increased to prevent a high-speed access.

As shown in the paper by R. P. Cenker et al, when a universal DRAM address comparing circuit is applied, as it is, to a synchronous DRAM, an external clock signal is applied, as the activating signal, to the gate of the charging transistor. In this case, when the frequency of the external clock signal becomes high, the external clock signal is changed in level to the inactivating level before the judging node is sufficiently charged to the "H" level when an address identical with the defective address is given. Thus, a redundancy judgement cannot be made. Further, to increase the speed of redundancy judgement, the charging transistor and the transistors in the address comparing unit are inevitably increased in size. This prevents the synchronous DRAM from being lowered in power consumption.

SUMMARY OF THE INVENTION

It is an object of the present invention to provide a semiconductor memory capable of receiving and supplying data in synchronism with an external clock signal at high speed with low power consumption.

To achieve the object above-mentioned, with attention placed on an internal column address to be successively updated according to a data burst length in a synchronous DRAM, the present invention realizes both improvements in redundancy judgement on the internal column address and feedback of the internal column address to an internal clock signal generating circuit.

More specifically, in a semiconductor memory according to the present invention, there are successively operated n address comparing circuits for redundancy judgement to each of which an internal column address is supplied, according to first to nth clock signals each of which has a time period of one cycle n-times the time period of one cycle of an external clock signal and which respectively have different phases from one another, provided that n is an integer not less than 2. For example, when n is equal to 2, two address comparing circuits in which the same defective address is programmed, alternately make a redundancy judgement according to complementary clock signals (first and second clock signals) obtained by dividing the frequency of the external clock signal by two. Accordingly, even though the frequency of the external clock signal is high, a sufficient time of judgement can be assured for each address comparing circuit, thus achieving an accurate redundancy judgement. Further, since a sufficient time of judgement is obtained, no adverse effect is exerted to a redundancy judgement even though the through-current is restrained by selecting small-size transistors for the transistors forming the two address comparing circuits. For a low-speed operation, the two address comparing circuits independently operate responsive to a redundancy judging mode setting signal, thereby to assure a high defect-relief efficiency. When taking the alternate appearance of odd and even addresses into consideration, provision may be made such that an address comparing circuit for an odd-numbered bank and an address comparing circuit for an even-numbered bank alternately make a redundancy judgement according to the complementary clock signals (the first and second clock signals).

Another semiconductor memory according to the present invention is arranged such that an internal clock signal having pulses in number equal to a data burst length, is generated with the use of an internal column address and distributed to a plurality of circuit blocks. According to such a semiconductor memory, there are simultaneously achieved (i) the update of an address with which the memory bank is accessed and (ii) the generation of the internal clock signal having pulses in number equal to the data burst length with the use of this address update, and the internal clock signal thus generated is distributed to the circuit blocks. Accordingly, the distributed internal clock signal can be utilized, as it is, in the respective circuit blocks.

BRIEF DESCRIPTION OF THE DRAWINGS

FIGS. 13(a) to 13(f) are views of signal wave forms illustrating an operation of the timing control circuit in FIG. 12.

DETAILED DESCRIPTION OF THE INVENTION

Figure 1:
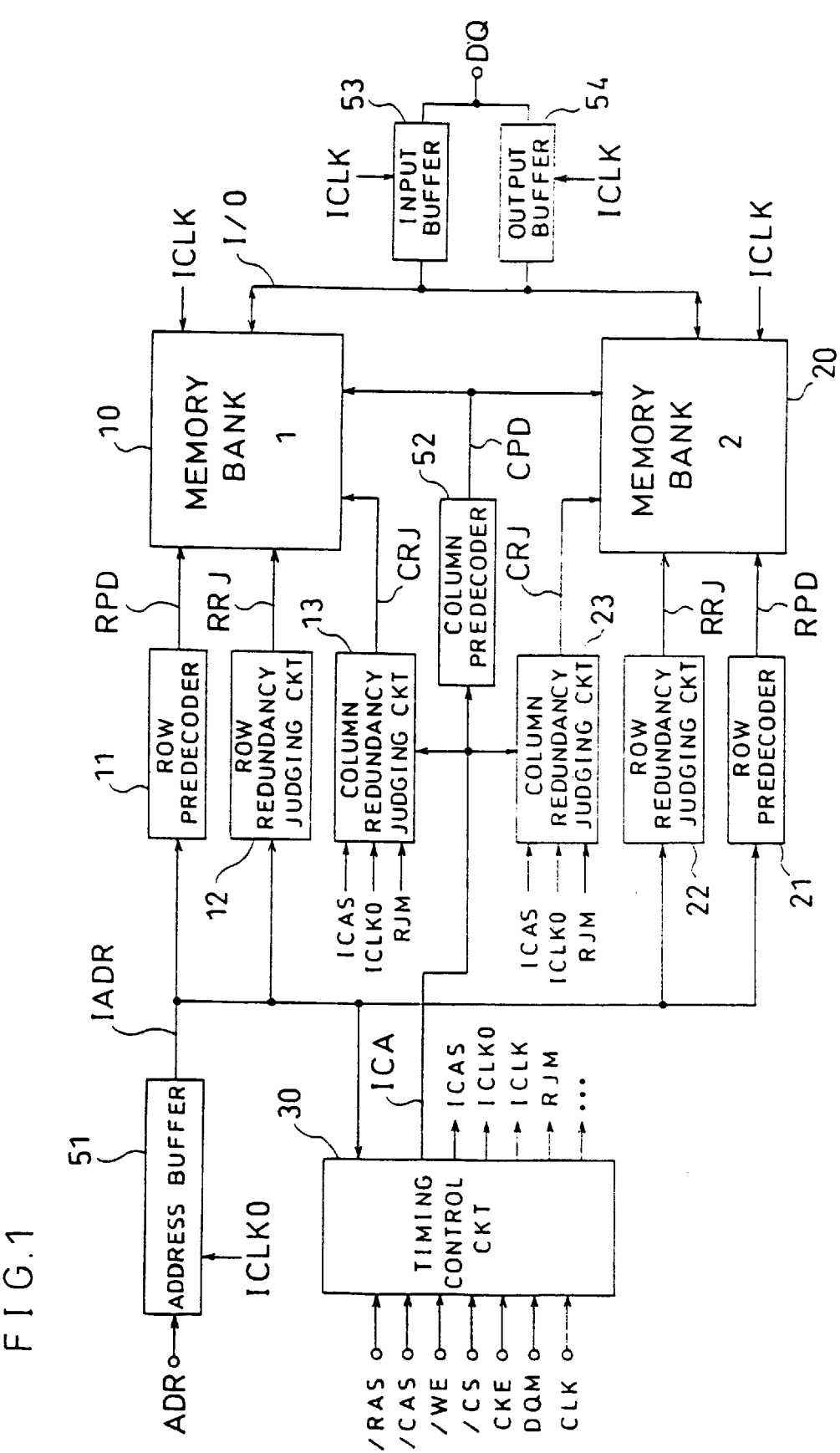
FIG. 1 is a block diagram of the general arrangement of a synchronous DRAM according to an embodiment of the present invention.

FIG. 1 is a block diagram of the general arrangement of a synchronous DRAM according to an embodiment of the present invention. Shown in FIG. 1 are a first memory bank 10 and a second memory bank 20. Disposed for the first memory bank 10 are a row predecoder 11, a row redundancy judging circuit 12 and a column redundancy judging circuit 13. Disposed for the second memory bank 20 are a row predecoder 21, a row redundancy judging circuit 22 and a column redundancy judging circuit 33. There are also disposed a timing control circuit 30, an address buffer 51, a column predecoder 52, an input buffer 53 and an output buffer 54.

The address buffer 51 is arranged to receive an external address ADR in which a row address and a column address are multiplexed, and to supply the row and column addresses given in the form of the external address ADR to each of the row predecoders 11, 21, each of the row redundancy judging circuits 12, 22, and the timing control circuit 30, such row and column addresses being supplied as an internal address IADR. The timing control circuit 30 is arranged to receive a column initial address given as the internal address IADR, an external RAS signal /RAS, an external CAS signal /CAS, a write enable signal /WE, a chip select signal /CS, a clock enable signal CKE, a data input/output mask signal DQM, and an external clock signal CLK. The timing control circuit 30 is also arranged to supply an internal column address ICA, an internal CAS signal ICAS, an internal continuous clock signal ICLK0, an internal clock signal ICLK, a redundancy judging mode setting signal RJM and the like. The internal column address ICA is successively incremented by 1 in the timing control circuit 30 from the initial address to the final address determined by a data burst length. The internal CAS signal ICAS is a signal which has an "H" level duration or an activating duration according to the data burst length. The internal continuous clock signal ICLK0 is a continuous clock signal having the same phase and the same time period of one cycle as those of the external clock signal CLK. The internal clock signal ICLK is a signal formed from the external clock signal CLK such that the internal clock signal ICLK has pulses in number corresponding to the data burst length. The redundancy judging mode setting signal RJM is a signal for setting the operational mode of the column redundancy judging circuit 13 (23) and arranged to make a redundancy judgement in a normal mode when the RJM is in the "L" level, and a redundancy judgement in a high speed mode when the RJM is in the "H" level. In the inside arrangement of the timing control circuit 30, the detailed description will be made later of a circuit arrangement for generating the internal column address ICA and the internal clock signal ICLK from the internal address IADR, the external CAS signal /CAS and the external clock signal CLK.

The row predecoder 11 (21) is arranged to receive a row address given as the internal address IADR and to supply a row predecode signal RPD to the first memory bank 10 (second memory bank 20). The row redundancy judging circuit 12 (22) is arranged to receive a row address given as the internal address IADR and to supply a row redundancy judging signal RRJ to the first memory bank 10 (second memory bank 20). The column redundancy judging circuit 13 (23) is arranged to receive the internal column address ICA, the internal CAS signal ICAS, the internal continuous clock signal ICLK0 and the redundancy judging mode setting signal RJM supplied from the timing control circuit 30, and to supply a column redundancy judging signal CRJ to the first memory bank 10 (second memory bank 20). The column predecoder 52 is arranged to receive the internal column address ICA and to supply a column predecode signal CPD to the first and second memory banks 10, 20.

The internal clock signal ICLK is supplied to the first memory bank 10, the second memory bank 20, the input buffer 53 and the output buffer 54. An internal I/O line is disposed among the first and second memory banks 10, 20, the input buffer 53 and the output buffer 54. The input buffer 53 is disposed for transmitting an item of data on a data line DQ to the internal I/O line. The output buffer 54 is disposed for transmitting an item of data on the internal I/O line to the data line DQ.

Figure 2:
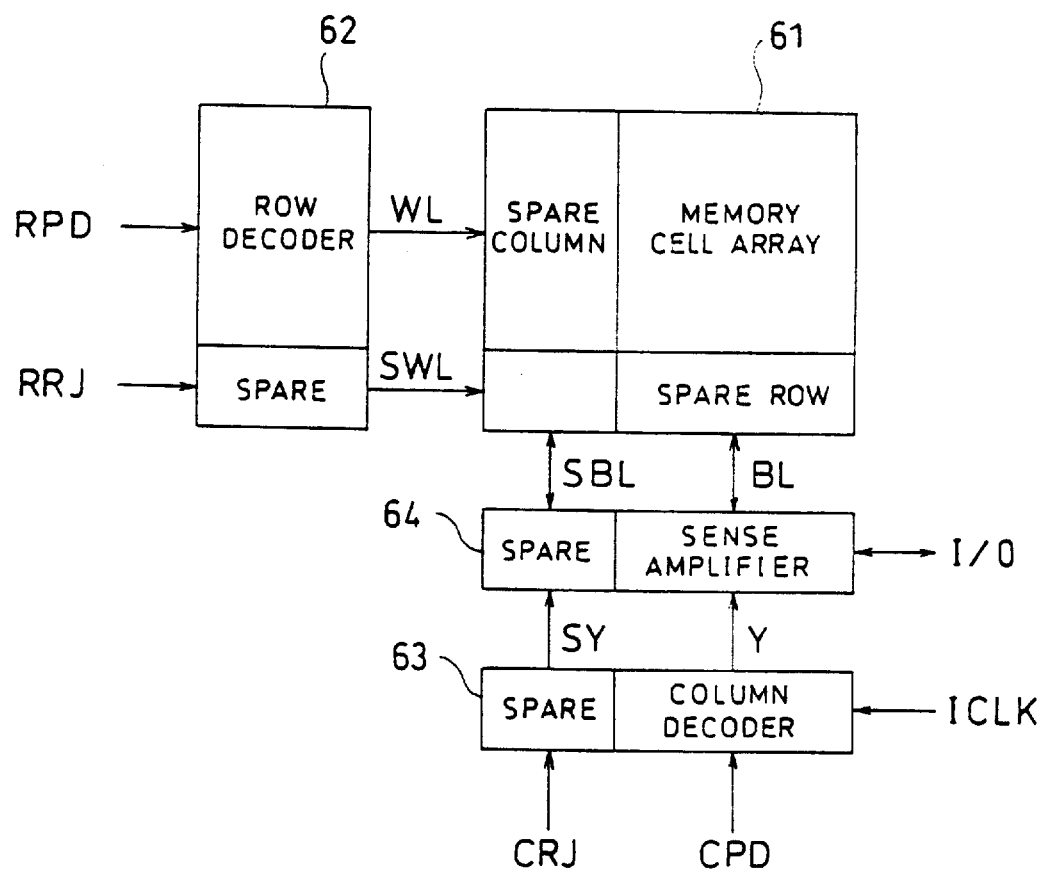
FIG. 2 is a block diagram of the inside arrangement of each of two memory banks shown in FIG. 1.

FIG. 2 shows the inside arrangement of each of the first and second memory banks 10, 20. Shown in FIG. 2 are a memory cell array 61 having spare rows and spare columns in the vicinity of a memory cell unit having normal rows and normal columns, a row decoder 62 having a spare, a column decoder 63 having a spare, and a sense amplifier 64 having a spare.

The row decoder 62 is arranged to activate a word line WL based on the row predecode signal RPD so as to select one of the normal rows, or to activate a spare word line SWL based on the row redundancy judging signal RRJ so as to select one of the spare rows instead of a defective normal row. The column decoder 63 is arranged to activate, in synchronism with the internal clock signal ICLK, a column line Y based on the column predecode signal CPD so as to select one of the normal columns, or to activate a spare column line SY based on the column redundancy judging signal CRJ so as to select one of the spare columns instead of a defective normal column. The sense amplifier 64 is interposed between the memory cell array 61 and the internal I/O line for connecting a spare bit line SBL or a bit line BL of the normal column selected by the column decoder 63, to the internal I/O line.

Figure 3:
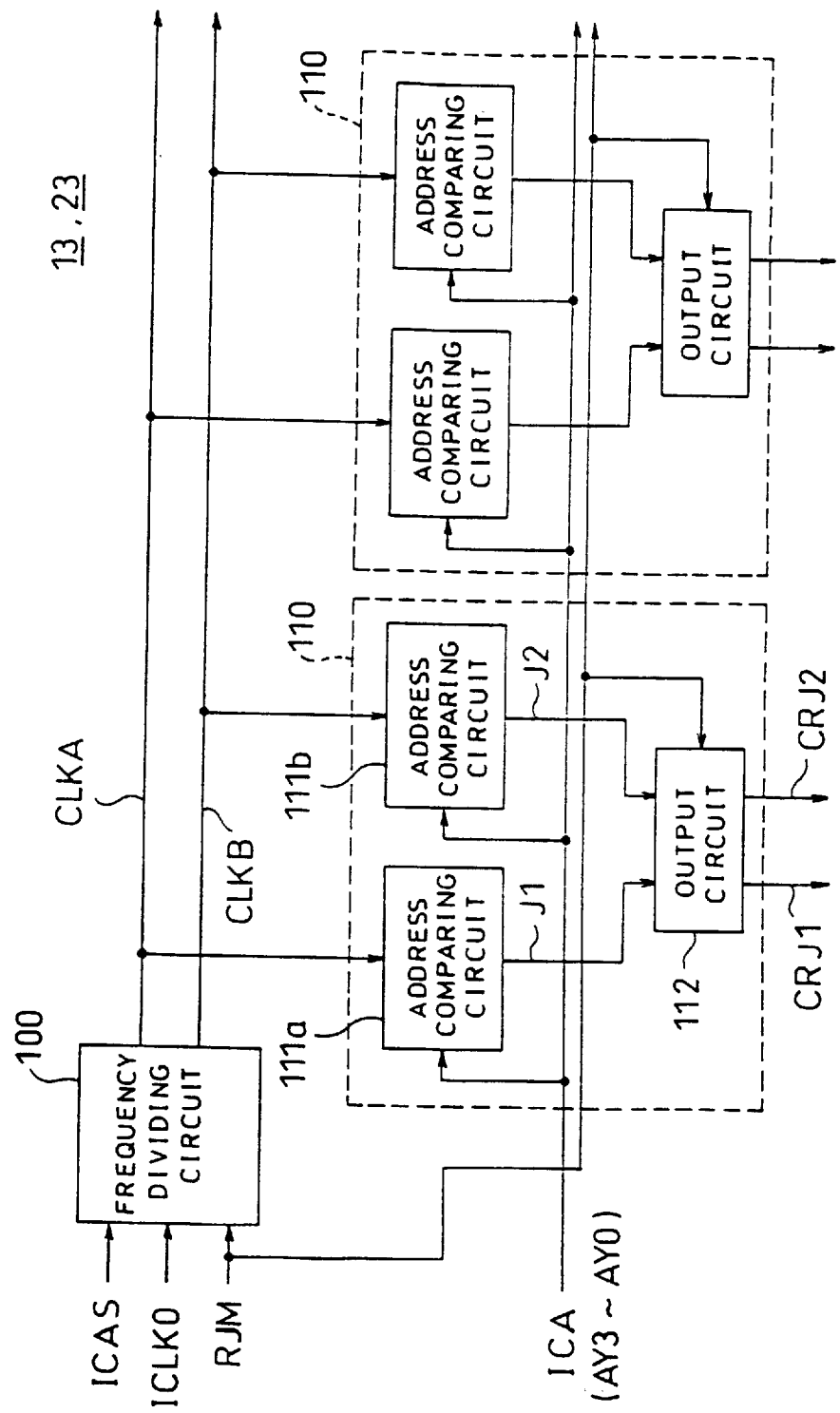
FIG. 3 is a block diagram of each of the column redundancy judging circuits in FIG. 1.

FIG. 3 shows the inside arrangement of each of the column redundancy judging circuits 13, 23 in FIG. 1. Shown in FIG. 3 are a frequency dividing circuit 100 and a plurality of judging circuits 110. Each of the judging circuits 110 has first and second address comparing circuits 111a, 111b, and an output circuit 112.

The frequency dividing circuit 100 is arranged to receive the internal CAS signal ICAS, the internal continuous clock signal ICLK0 and the redundancy judging mode setting signal RJM, and to supply a first clock signal CLKA and a second clock signal CLKB to the judging circuits 110 only when the internal CAS signal ICAS is activated. More specifically, when the redundancy judging mode setting signal RJM is set to the "H" level, the frequency dividing circuit 100 generates the first and second clock signals CLKA, CLKB each of which has a time period of one cycle twice the time period of one cycle of the internal continuous clock signal ICLK0 obtained by dividing the frequency of the internal continuous clock signal ICLK0 by two, and which have complementary phases. When the redundancy judging mode setting signal RJM is set to the "L" level, the frequency dividing circuit 100 generates the first and second clock signals CLKA, CLKB each of which has the same time period of one cycle and the same phase as those of the internal continuous clock signal ICLK0.

Figure 4:
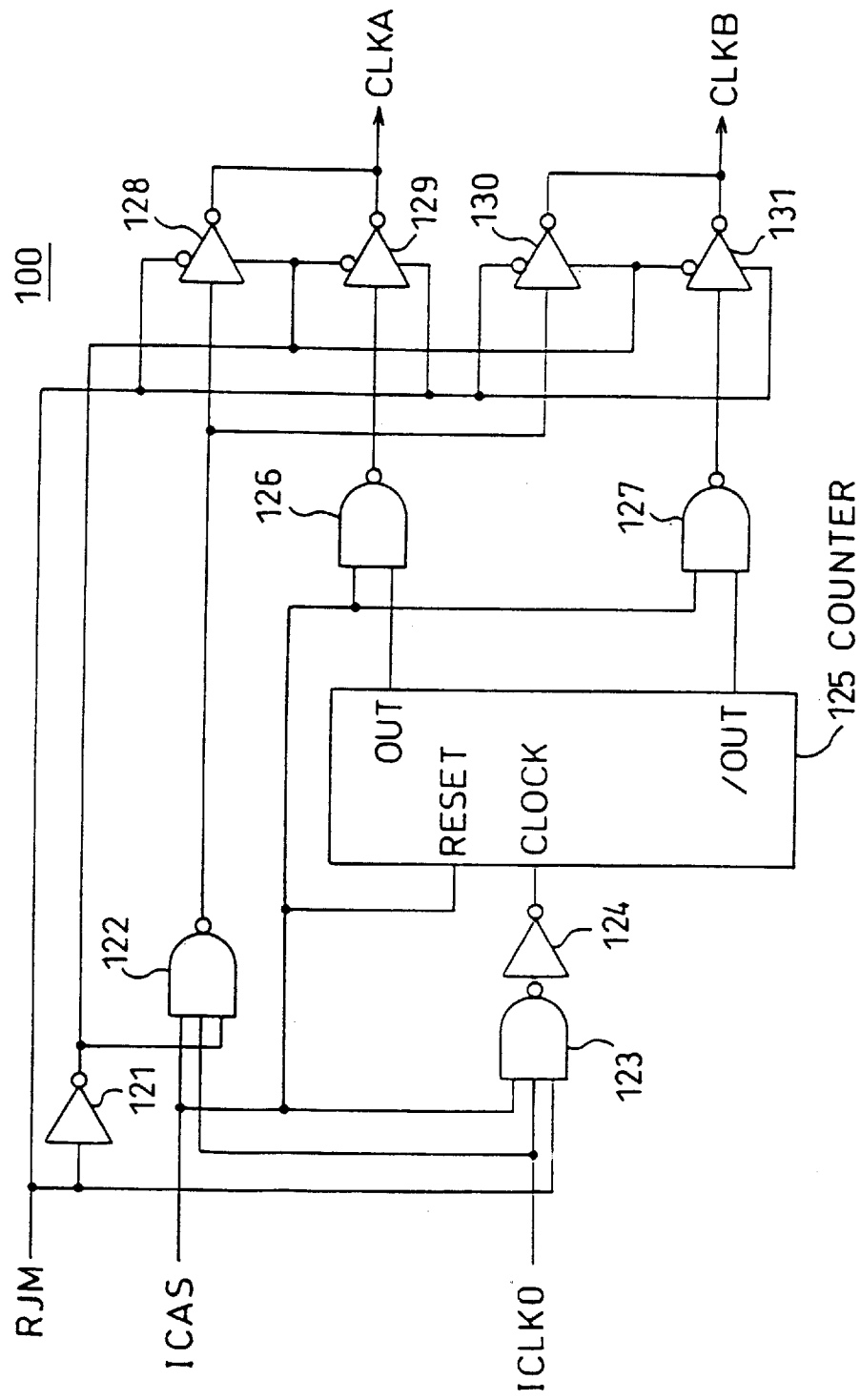
FIG. 4 is a circuit diagram of the inside arrangement of the frequency dividing circuit in FIG. 3.
Figure 5:
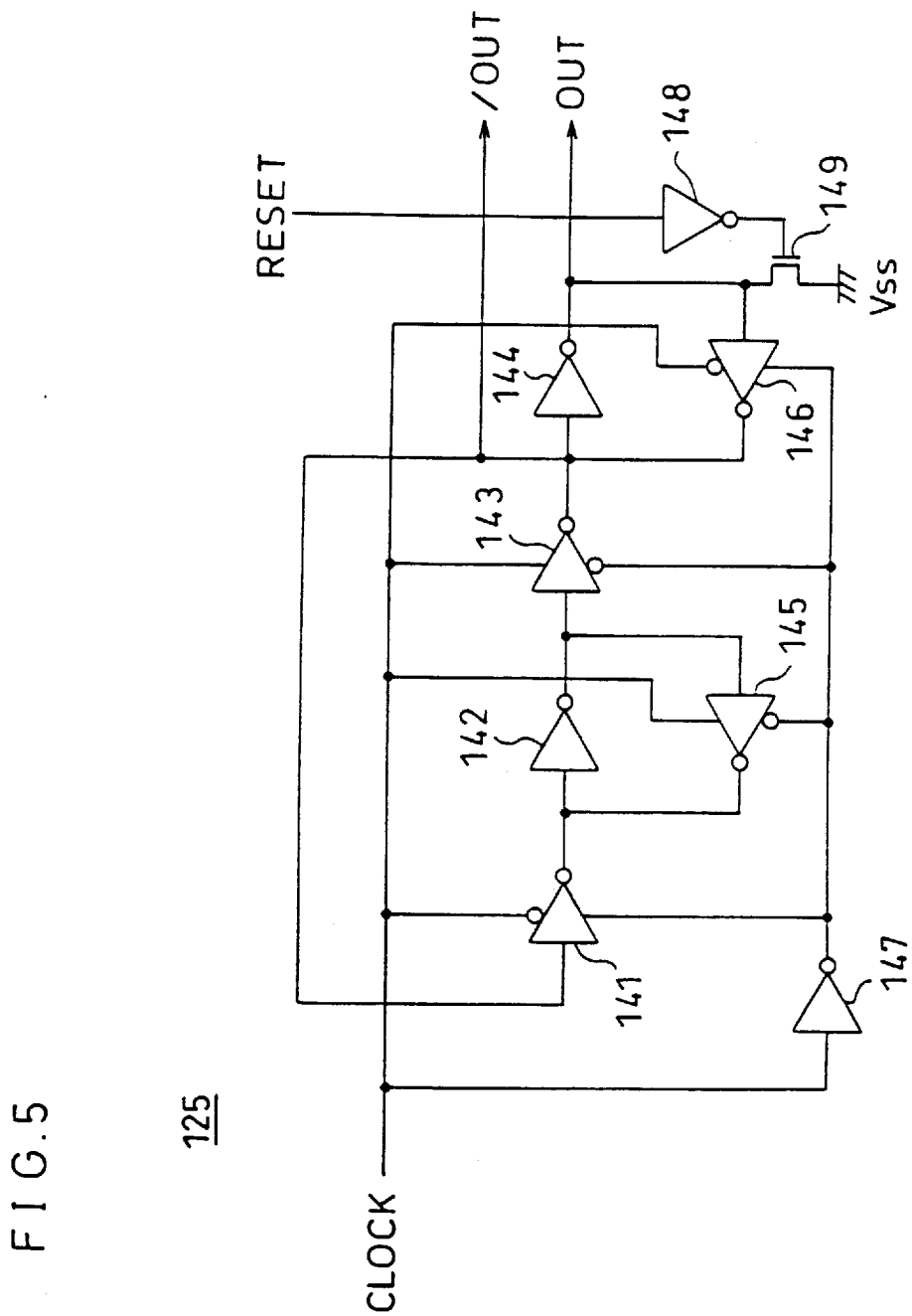
FIG. 5 is a circuit diagram of the inside arrangement of the counter in FIG. 4.

FIG. 4 shows the inside arrangement of the frequency dividing circuit 100. Shown in FIG. 4 are an inverter circuit 121, 3-input NAND circuits 122, 123, an inverter circuit 124, a counter 125, 2-input NAND circuits 126, 127, and clocked inverter circuits 128, 129, 130, 131. FIG. 5 shows the inside arrangement of the counter 125 in FIG. 4. Shown in FIG. 5 are a clocked inverter circuit 141, an inverter circuit 142 and a clocked inverter circuit 143, these circuits 141, 142, 143 being connected in the form of a ring. Also shown in FIG. 5 are an inverter circuit 144, clocked inverter circuits 145, 146, inverter circuits 147, 148 and an NMOS transistor 149.

In each of the judging circuits 110 in FIG. 3, the first address comparing circuit 111a is arranged to receive the internal column address ICA and the first clock signal CLKA, and to supply a first judgement signal J1. The second address comparing circuit 111b is arranged to receive the same internal column address ICA and the second clock signal CLKB, and to supply a second judgement signal J2.

Figure 6:
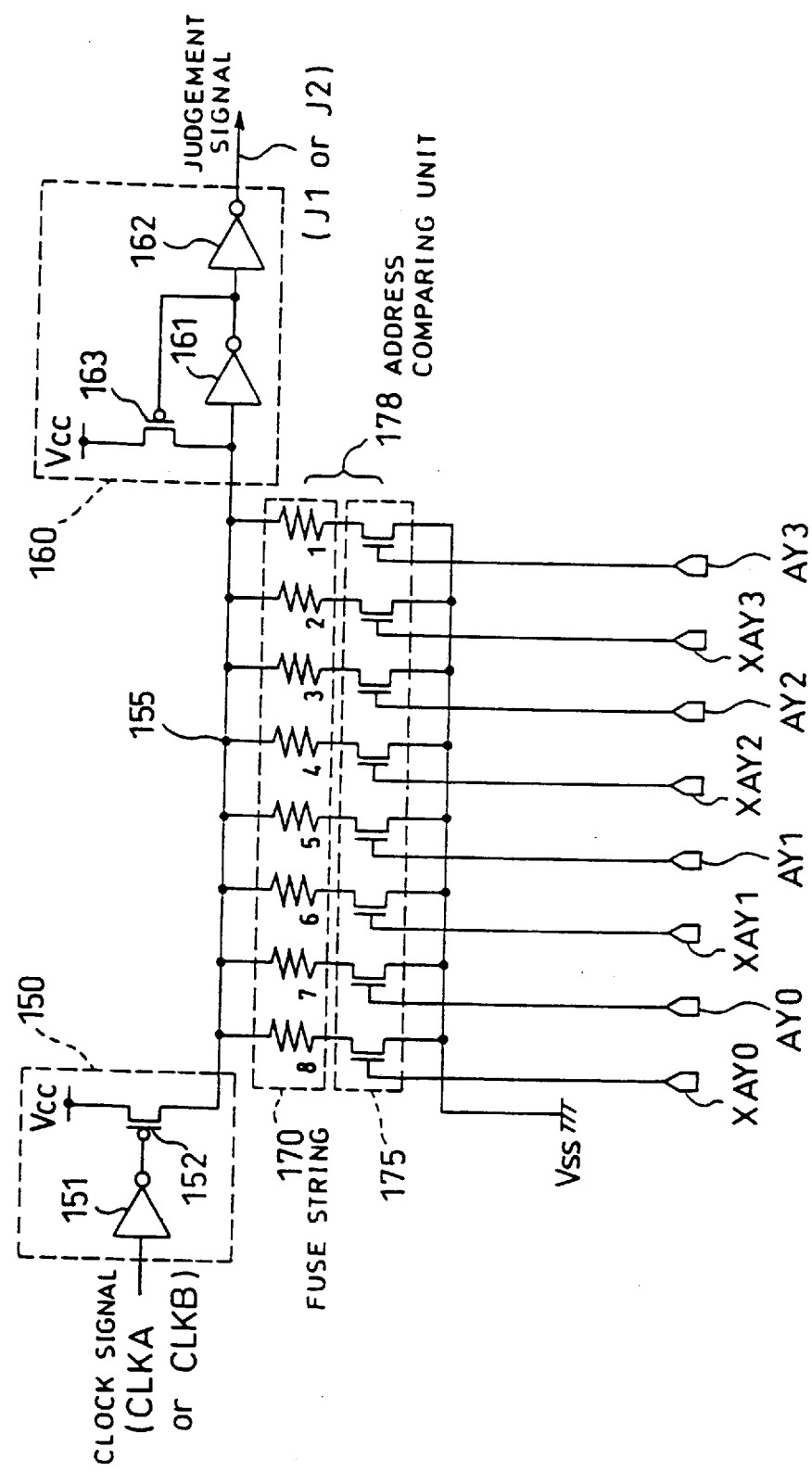
FIG. 6 is a circuit diagram of the inside arrangement of each of the address comparing circuits in FIG. 3.

FIG. 6 shows the inside arrangement of each of the address comparing circuits 111a, 111b. Shown in FIG. 6 are a charging circuit 150, a latch circuit 160, a fuse string 170, an NMOS transistor string 175. The fuse string 170 and the NMOS transistor string 175 form an address comparing unit 178. In FIG. 6, each address comparing circuit 111a, 111b is arranged on the assumption that there are entered, as a signal representing the internal column address ICA, a 4-bit address signal AY3 to AY0 and its inversion signal XAY3 to XAY0. The charging circuit 150 has an inverter circuit 151, and a PMOS transistor 152 interposed between a power source node VCC and a judging node 155, and is arranged to charge the judging node 155 to the "H" level while the clock signal (CLKA or CLKB) is in the "H" level. The latch circuit 160 has two inverter circuits 161, 162 and one PMOS transistor 163, and is arranged to amplify the change in potential of the judging node 155 such that the logic of the judgement signal (J1 or J2) is determined. The fuse string 170 comprises eight fuse elements made of polysilicon, and the NMOS transistor string 175 comprises eight NMOS transistors. Thus, eight series circuits of the fuse elements and NMOS transistors are interposed between the judging node 155 and the grounding node VSS. The address signal AY3 to AY0 and its inversion signal XAY3 to XAY0 are given to gate electrodes of each of the eight NMOS transistors forming the NMOS transistor string 175.

For example, when "1000 (binary number)" is to be programmed, as a defective column address, in the address comparing unit 178, the first, fourth, sixth and eighth fuse elements from the right end of the fuse string 170 are disconnected by laser. Thus, when a signal ([AY3, AY2, AY1, AY0]=1000 and [XAY3, XAY2, XAY1, XAY0]=0111) representing an internal column address identical with the programmed defective column address, is supplied to the gate electrodes of the transistors forming the NMOS transistor string 175, there is not produced a current path from the judging node 155 to the grounding node VSS. Accordingly, the operation of the charging circuit 150 causes the judging node 155 to be raised to the "H" level such that the judgement signal (J1 or J2) is brought to the "H" level. On the other hand, when an internal column address which is not identical with the programmed defective column address, is supplied, there is generated a current path from the judging node 155 to the grounding node VSS. Accordingly, even though the charging circuit 150 is operated, the judging node 155 is not raised to the "H" level and the judgement signal (J1 or J2) is brought to the "L" level. To restrain the through-current from the power source node VCC to the grounding node VSS, small-size transistors are selected for the PMOS transistor 152 of the charging circuit 150 and the eight NMOS transistors forming the NMOS transistor string 175.

Figure 7:
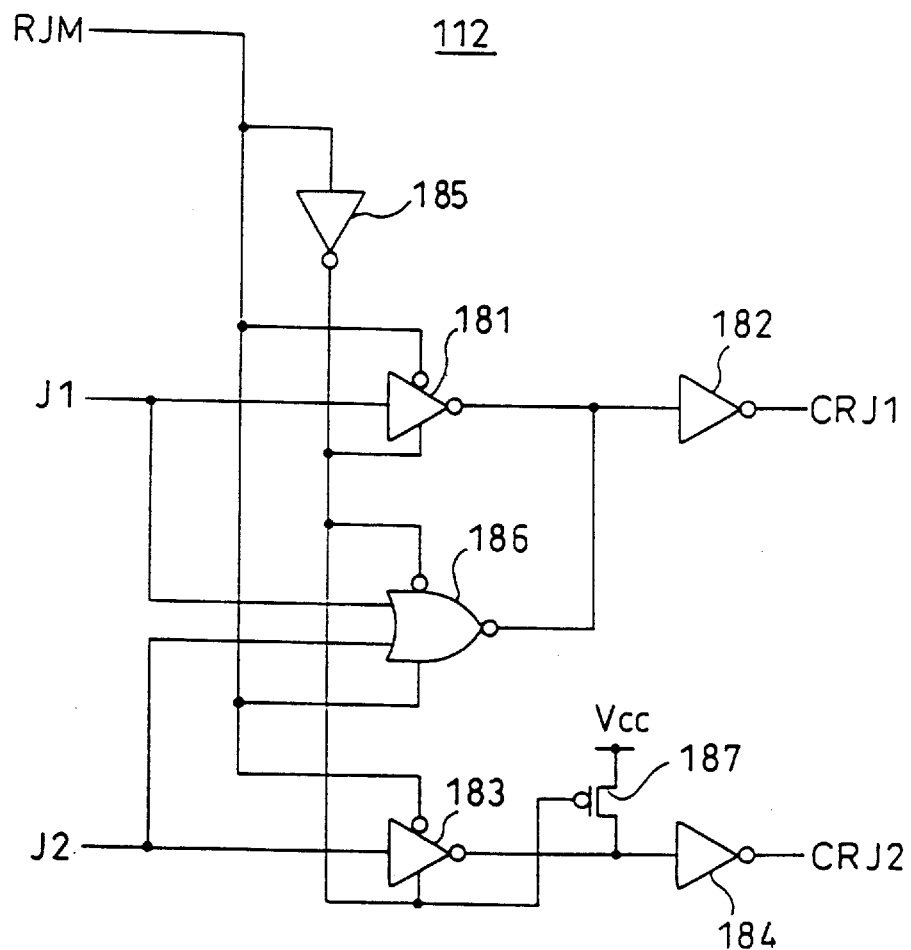
FIG. 7 is a circuit diagram of the inside arrangement of each of the output circuits in FIG. 3.

Each output circuit 112 in FIG. 3 is arranged to receive the first judgement signal J1, the second judgement signal J2 and the redundancy judging mode setting signal RJM. Each output circuit 112 is also arranged to supply, as a first column redundancy judging signal CRJ1, a signal of logical sum of the first judgement signal J1 and the second judgement signal J2 when the redundancy judging mode setting signal RJM is set to the "H" level. Each output circuit 112 is also arranged to supply, as first and second column redundancy judging signals CRJ1, CRJ2, the first and second judgement signals J1, J2 as they are, when the redundancy judging mode setting signal RJM is set to the "L" level. FIG. 7 shows the inside arrangement of each output circuit 112. Shown in FIG. 7 are clocked inverter circuits 181, 183, inverter circuits 182, 184, 185, a clocked 2-input NOR circuit 186, and a PMOS transistor 187.

The following description will discuss the operation of each column redundancy judging circuit 13 or 23 having the arrangement in FIG. 3.

Figure 8:
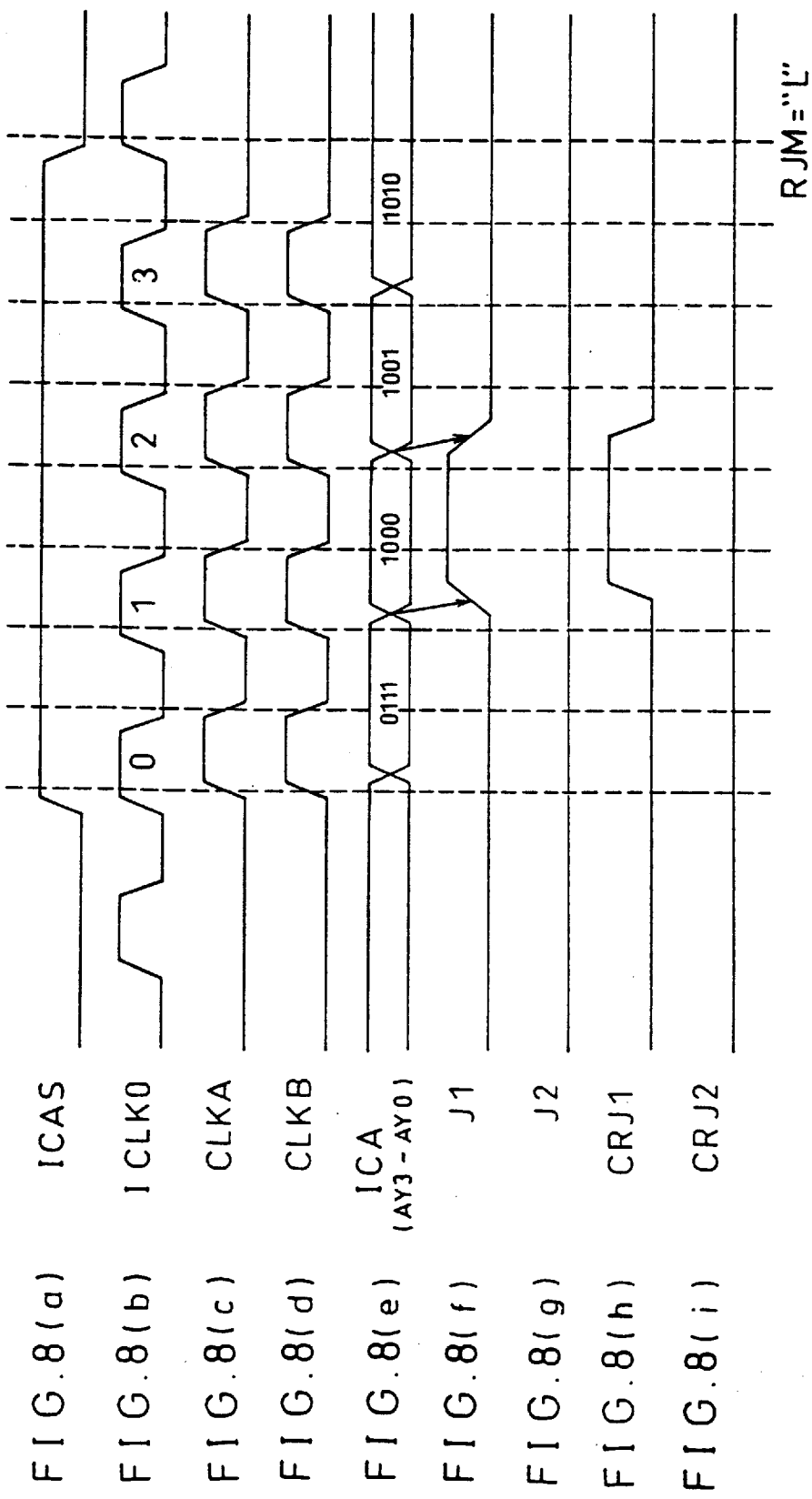
FIGS. 8(a) to 8(i) are views of signal wave forms illustrating an operation of the column redundancy judging circuit in FIG. 3 when the redundancy judging mode setting signal is in the "L" level.

When the external clock signal CLK with frequency of 100 MHz (clock period of 10 ns) for example is to be supplied to this synchronous DRAM, different defective column addresses are programmed in the two address comparing circuits 111a, 111b of each judging circuit 110 and the redundancy judging mode setting signal RJM in the "L" level is supplied to the frequency dividing circuit 100 and the output circuits 112. FIGS. 8(a) to 8(i) are views of signal wave forms illustrating an example of the operation of each column redundancy judging circuit 13 or 23 when the RJM is in the "L" level (normal mode). It is now supposed that the data burst length is equal to 4 and that "1000 (binary number)" is programmed as a defective column address in the first address comparing circuit 111a of a judging circuit 110. As shown in FIGS. 8(c) and 8(d), only when the internal CAS signal ICAS is activated, the frequency dividing circuit 100 supplies, to each of the judging circuits 110, the first and second clock signals CLKA, CLKB each of which has the same time period of one cycle and the same phase as those of the internal continuous clock signal ICLK0 (consequently same as those of the external clock signal CLK). During the time period when the first clock signal CLKA is in the "H" level (duration of 5 ns). the first address comparing circuit 111a of each of the judging circuits 110 compares the given internal column address ICA with the previously programmed corresponding defective column address, thereby to determine the logic level of the corresponding first judgement signal J1. During the time period when the first clock signal CLKA is in the "L" level (duration of 5 ns), this first address comparing circuit 111a maintains the logic level of the corresponding first judgement signal J1 thus determined. During the time period when the second clock signal CLKB is in the "H" level (duration of 5 ns), the second address comparing circuit 111b of each of the judging circuits 110 compares the given internal column address ICA with the previously programmed corresponding defective column address, thereby to determine the logic level of the corresponding second judgement signal J2. During the time period when the second clock signal CLKB is in the "L" level (duration of 5 ns), this second address comparing circuit 111b maintains the logic level of the corresponding second judgement signal J2 thus determined. Accordingly, the first and second address comparing circuits 111a, 111b simultaneously make respective redundancy judgements. Thus, as shown in FIG. 8(e), when the internal column address ICA is updated to "1000", the first address comparing circuit 111a in which "1000" has been programmed, supplies the corresponding judgement signal J1 in the "H" level as shown in FIG. 8(f). Upon reception of the judgement signal J1, the corresponding output circuit 112 supplies a column redundancy judging signal CRJ1 in the "H" level as shown in FIG. 8(h).

There is encountered the problem that no redundancy judgement can be made when the frequency of the external clock signal CLK is increased. More specifically, when the internal column address ICA is updated to an address identical with one of the defective column addresses, the clock signal (CLKA or CLKB) is changed in level to the "L" level before the corresponding judging node 155 is sufficiently charged to the "H" level or while the corresponding judging node 155 is charged only to a level less than the threshold value of the latch circuit 160. In such a case, even though the internal column address ICA becomes identical with one of the defective column addresses, no judgement signal (J1 or J2) in the "H" level is supplied.

Figure 9:
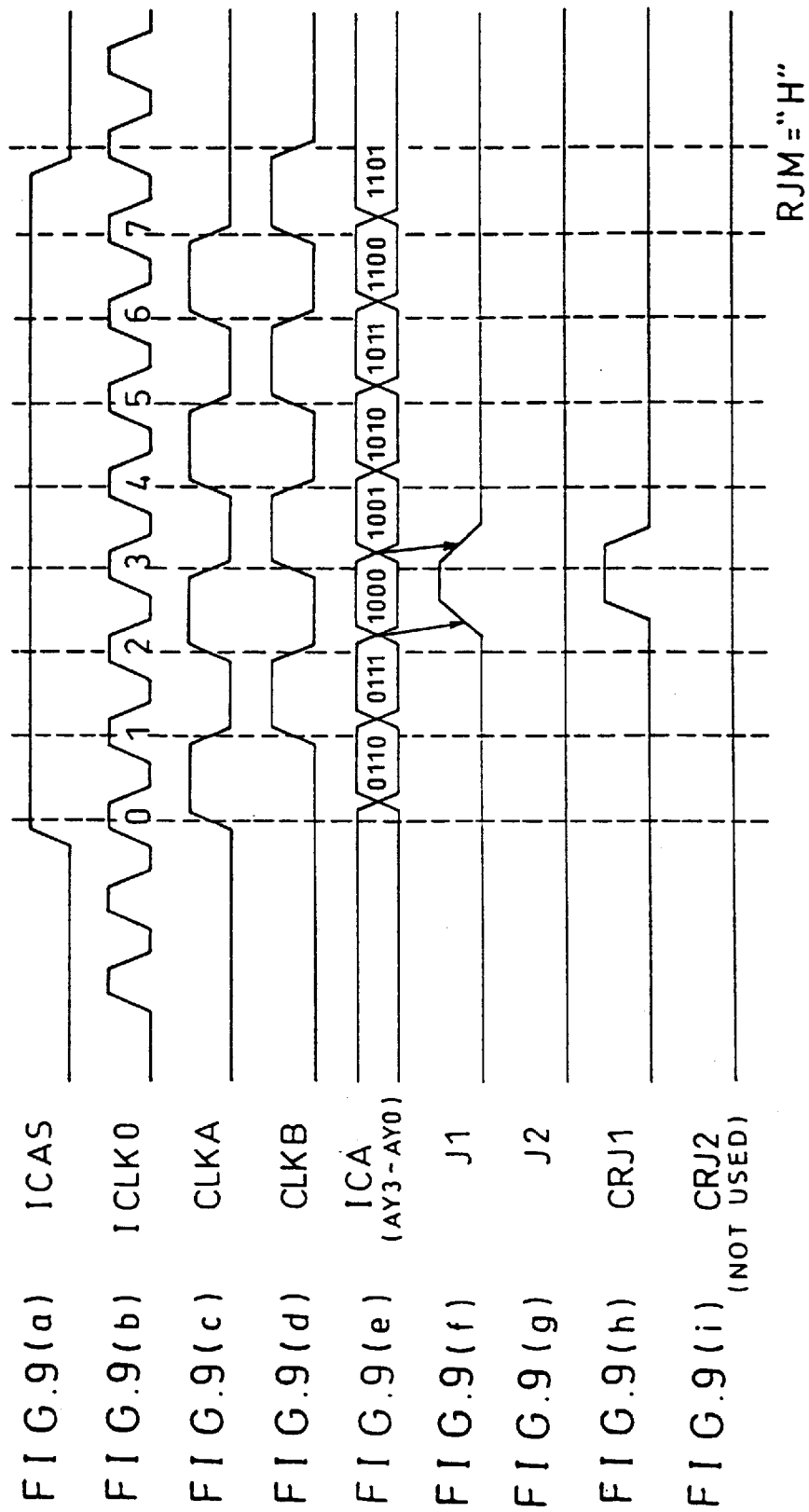
FIGS. 9(a) to 9(i) are views of signal wave forms illustrating an operation of the column redundancy judging circuit in FIG. 3 when the redundancy judging mode setting signal is in the "H" level.
Figure 10:
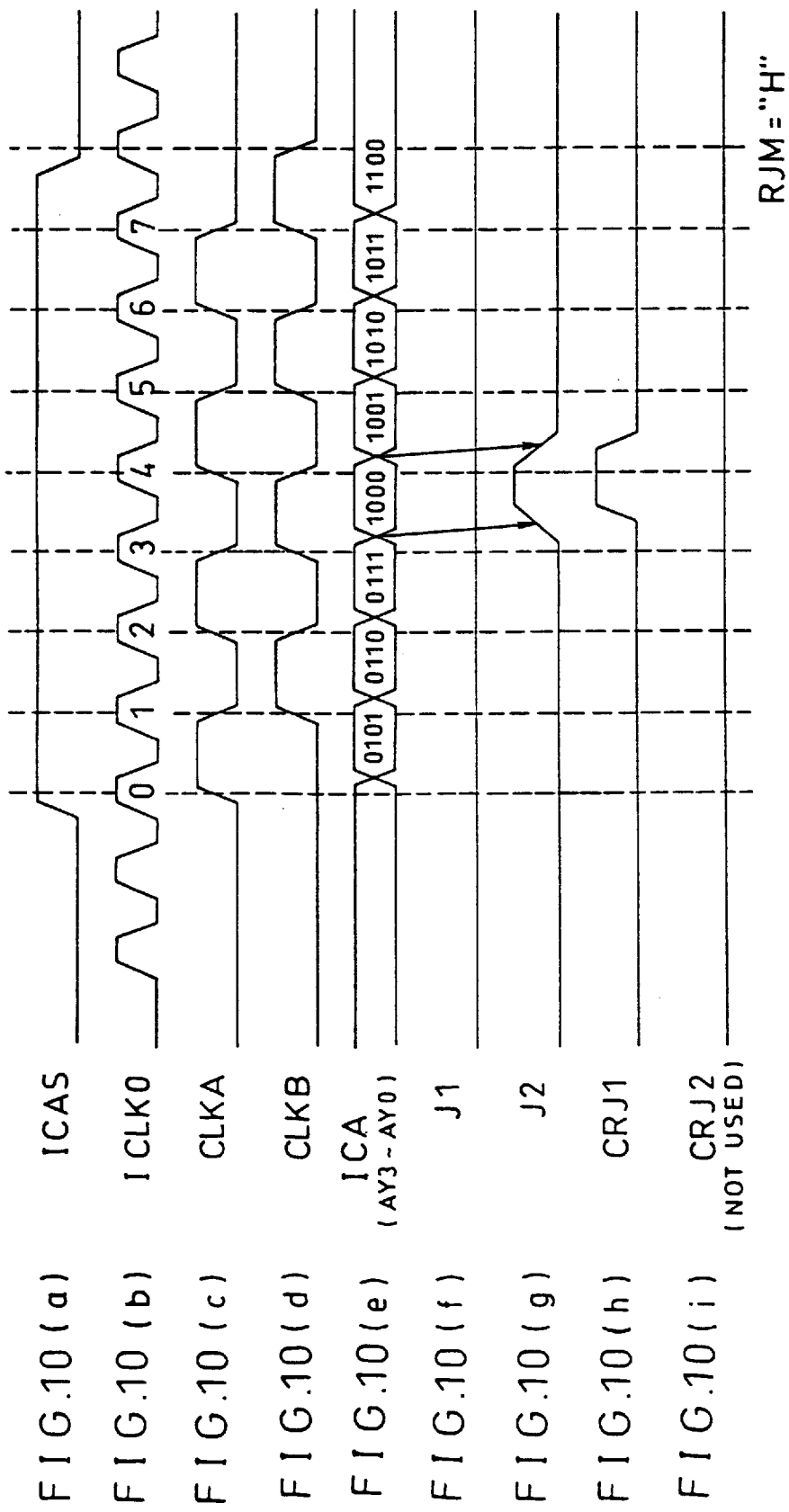
FIGS. 10(a) to 10(i) are views of signal wave forms illustrating another operation of the column redundancy judging circuit in FIG. 3 when the redundancy judging mode setting signal is in the "H" level.

Accordingly, when the external clock signal CLK with frequency of 250 MHz (clock period of 4 ns) for example, is to be supplied to this synchronous DRAM, the same defective column address is programmed in the two address comparing circuits 111a, 111b of each judging circuit 110, and the redundancy judging mode setting signal RJM in the "H" level is supplied to the frequency dividing circuit 100 and the output circuits 112. FIGS. 9(a) to 9(i) are views of signal wave forms illustrating an example of the operation of each column redundancy judging circuit 13 or 23 when the RJM is in the "H" level (high speed mode). It is now supposed that the data burst length is equal to 8 and that "1000 (binary number)" is programmed as a defective column address in the first and second address comparing circuits 111a, 111b of a judging circuit 110. As shown in FIGS. 9(c) and 9(d), only when the internal CAS signal ICAS is activated, the frequency dividing circuit 100 supplies, to each of the judging circuits 110, first and second complementary clock signals CLKA, CLKB each of which has a time period of one cycle twice the time period of one cycle of the internal continuous clock signal ICLK0, or a clock period of 8 ns. During the time period when the first clock signal CLKA is in the "H" level (duration of 4 ns), the first address comparing circuit 111a of each of the judging circuits 110 compares the given internal column address ICA with the previously programmed corresponding defective column address, thereby to determine the logic level of the corresponding first judgement signal J1. During the time period when the second clock signal CLKB is in the "H" level (duration of 4 ns), the second address comparing circuit 111b of each of the judging circuits 110 compares the given internal column address ICA with the previously programmed corresponding defective column address, thereby to determine the logic level of the corresponding second judgement signal J2. Accordingly, the first and second address comparing circuits 111a, 111b alternately make respective redundancy judgements. Thus, as shown in FIG. 9(e), when the internal column address ICA is updated to "1000" during the time period when the first clock signal CLKA is in the "H" level, the first address comparing circuit 111a in which "1000" has been programmed, supplies the corresponding judgement signal J1 in the "H" level as shown in FIG. 9(f). Upon reception of the judgement signal J1, the corresponding output circuit 112 supplies a column redundancy judging signal CRJ1 in the "H" level as shown in FIG. 9(h). FIGS. 10(a) to 10(i) show the operations made at the time when the internal column address ICA is updated to "1000" during the time period when the second clock signal CLKB is in the "H" level. In this case, the second address comparing circuit 111b in which "1000" has been programmed, supplies a corresponding judgement signal J2 in the "H" level as shown in FIG. 10(g). Upon reception of the judgement signal J2, the corresponding output circuit 112 supplies a column redundancy judging signal CRJ1 in the "H" level as shown in FIG. 10(h).

The frequency dividing circuit 100 shown in FIGS. 4 and 5 is arranged such that the outputs OUT and /OUT of the counter 125 are reset while the internal CAS signal ICAS is inactive (in the "L" level), and that the first clock signal CLKA first rises before the second clock signal CLKB when the RJM is in the "H" level. The PMOS transistor 187 of the output circuit 112 in FIG. 7 is disposed for maintaining, at the "L" level, a second column redundancy judging signal CRJ2 which is not used when the RJM is in the "H" level.

Thus, in the high speed mode, each column redundancy judging circuit 13 or 23 having the arrangement in FIG. 3 is operated in the following manner. According to the complementary clock signals CLKA, CLKB of which frequencies have been lowered, redundancy judgements are alternately made by the two address comparing circuits 111a, 111b of each judging circuit 110 whereby the same defective column address has been programmed in the two address comparing circuits 111a, 111b. Accordingly, even though the frequency of the external clock signal CLK is high, there can be obtained a sufficient time of redundancy judgement, thus achieving an accurate column redundancy judgement. Further, since a sufficient time of redundancy judgement is obtained, no adverse effect is exerted to a column redundancy judgement even though the through-current from the power source node VCC to the grounding node VSS is restrained by selecting small-size transistors for the PMOS transistor 152 of the charging circuit 150 and for eight NMOS transistors forming the NMOS transistor string 175. Thus, there can be achieved a synchronous DRAM which is operable at such high speed as to enable a synchronous operation even with a high-frequency clock signal such as a master clock signal in the MPU system, and which is low in power consumption.

In the normal mode, two different defective column addresses are programmed in the two address comparing circuits 111a, 111b of each judging circuit 110. Thus, the independent operations of both address comparing circuits assure a high defect-relief efficiency.

Figure 11:
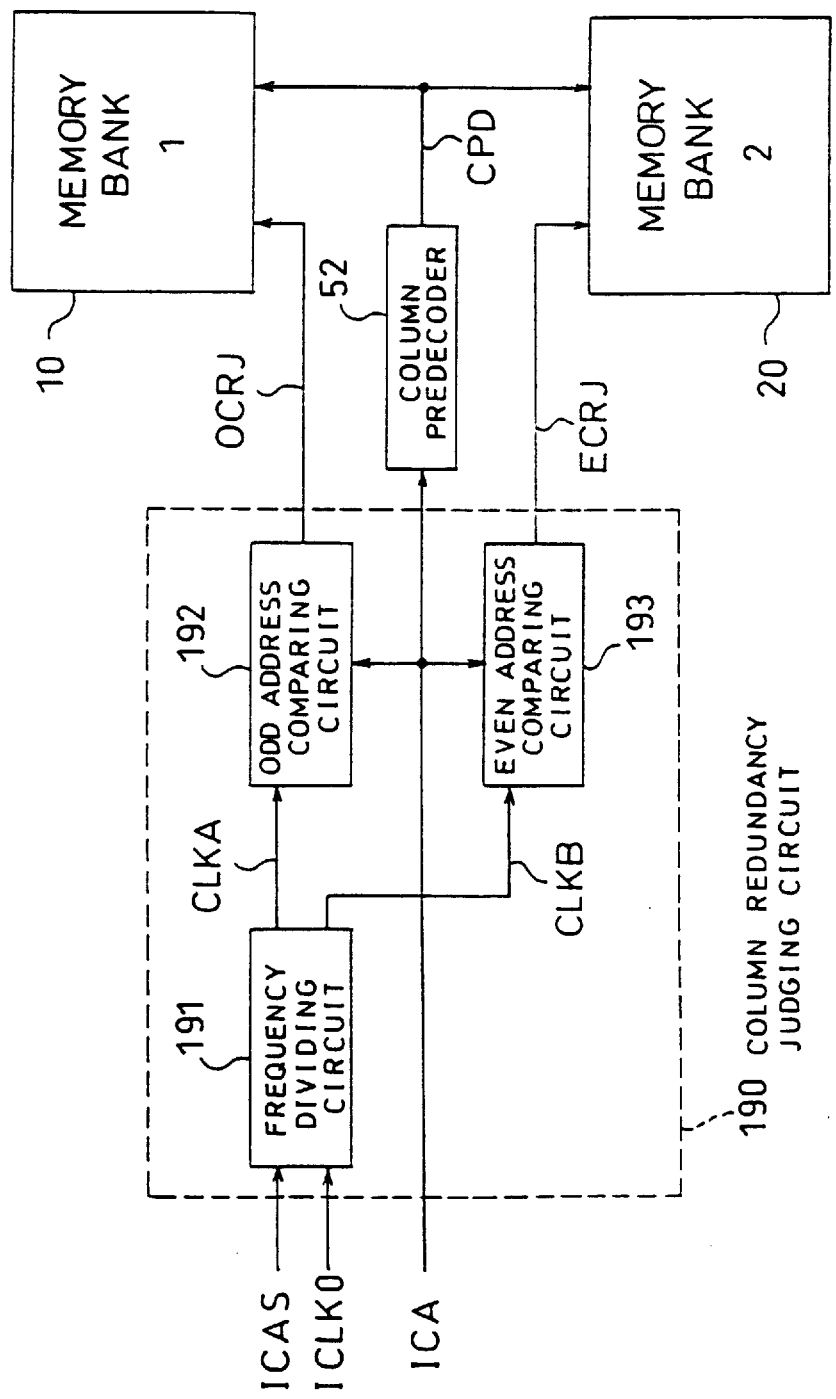
FIG. 11 is a block diagram of a modification of the column redundancy judging circuits in FIG. 1.

FIG. 11 shows a modification where two column redundancy judging circuits 13, 23 in FIG. 1 are integrated in a single circuit. In FIG. 11, it is supposed that odd column addresses are assigned to normal and spare columns of a first memory bank 10, while even column addresses are assigned to normal and spare columns of a second memory bank 20. A column redundancy judging circuit 190 has a frequency dividing circuit 191, an odd address comparing circuit 192 and an even address comparing circuit 193. The column redundancy judging circuit 190 is arranged to receive an internal column address ICA, an internal CAS signal ICAS and an internal continuous clock signal ICLK0, and is also arranged to supply an odd column redundancy judging signal OCRJ to the first memory bank 10 and an even column redundancy judging signal ECRJ to the second memory bank 20.

The frequency dividing circuit 191 in FIG. 11 is arranged to receive the internal CAS signal ICAS and the internal continuous clock signal ICLK0 and to supply a first clock signal CLKA to the odd address comparing circuit 192 and a second clock signal CLKB to the even address comparing circuit 193 only when the internal CAS signal ICAS is activated. These clock signals CLKA, CLKB are clock signals each of which has a time period of one cycle twice the time period of one cycle of the internal continuous clock signal ICLK0 obtained by dividing the frequency of the internal continuous clock signal ICLK0 by two and which have complementary phases. The odd address comparing circuit 192 is arranged to receive the internal column address ICA and the first clock signal CLKA and to supply the odd column redundancy judging signal OCRJ. Only odd addresses are programmed as defective column addresses in the odd address comparing circuit 192. The even address comparing circuit 193 is arranged to receive the internal column address ICA and the second clock signal CLKB and to supply the even column redundancy judging signal ECRJ. Only even addresses are programmed as defective column addresses in the even address comparing circuit 193. The inside arrangement of each of the odd address comparing circuit 192 and the even address comparing circuit 193 is similar to that shown in FIG. 6.

The internal column address ICA is successively incremented by 1 from the initial address to the final address to be determined by the data burst length. Accordingly, odd and even internal column addresses ICA appear alternately. Thus, the column redundancy judging circuit 190 in FIG. 11 is correspondingly arranged such that the two address comparing circuits 192, 193 alternately make redundancy judgements according to the frequency-divided complementary clock signals CLKA, CLKB. Therefore, even though the external clock signal CLK is high in frequency, a sufficient time of redundancy judgement can be obtained, thus achieving an accurate column redundancy judgement. That is, likewise in the column redundancy judging circuit having the arrangement in FIG. 3, there can be achieved a high-speed synchronous DRAM low in power consumption.

Figure 12:
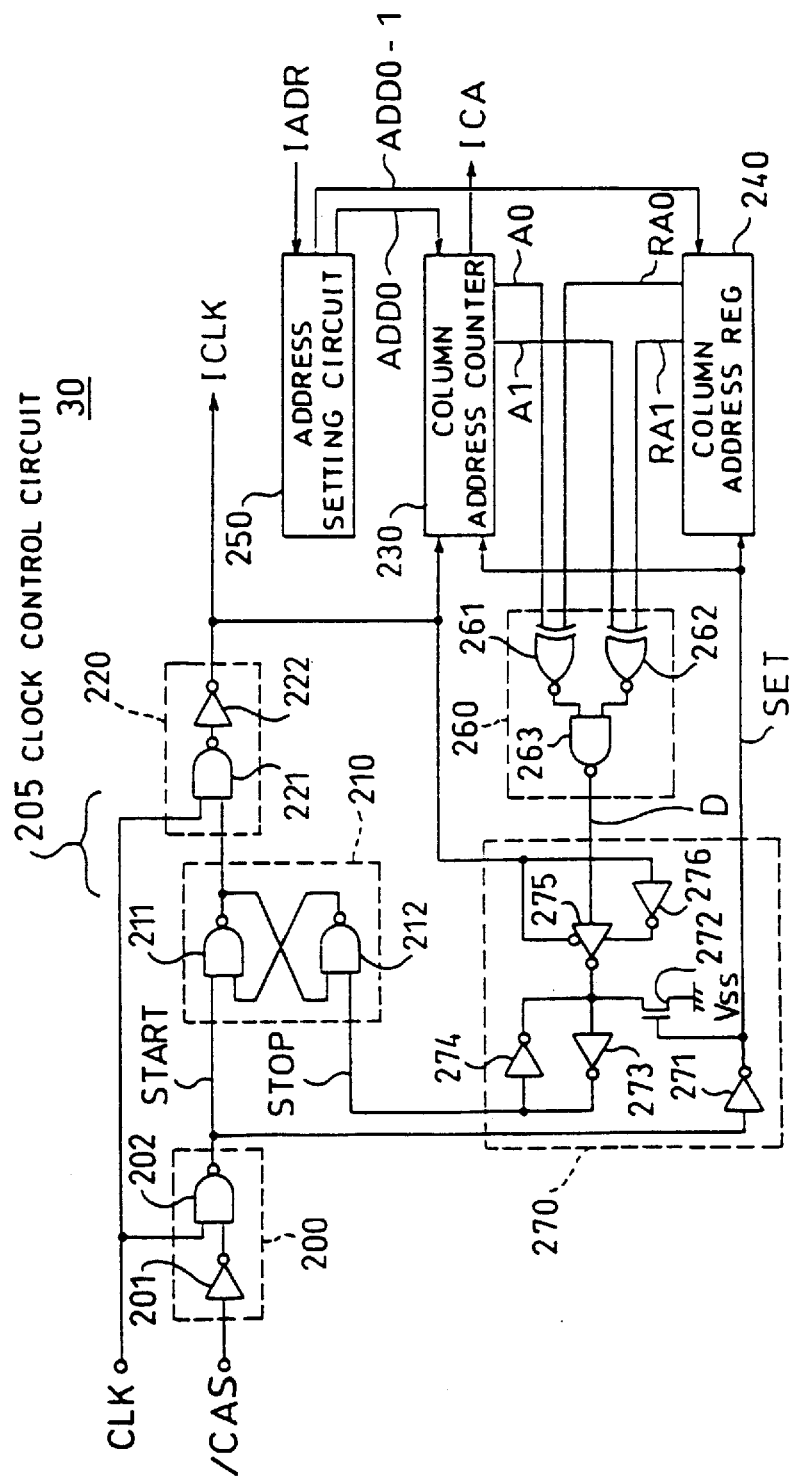
FIG. 12 is a circuit diagram illustrating a portion of the inside arrangement of the timing control circuit in FIG. 1.

FIG. 12 shows a circuit arrangement, out of the inside arrangement of the timing control circuit 30 in FIG. 1, for generating the internal column address ICA and the internal clock signal ICLK from the internal address IADR, the external CAS signal /CAS and the external clock signal CLK. Here, it is supposed that the data burst length is equal to 4. Shown in FIG. 12 are an internal clock starting circuit 200, an RS flip-flop 210, a gate circuit 220, a column address counter 230, a column address register 240, an address setting circuit 250, a comparing circuit 260, and an internal clock stop circuit 270. The RS flip-flop 210 and the gate circuit 220 form a clock control circuit 205.

The internal clock starting circuit 200 is disposed for generating a pulse-like internal clock starting signal START from the external CAS signal /CAS and the external clock signal CLK, and is formed by an inverter circuit 201 and a 2-input NAND circuit 202. The RS flip-flop 210 is formed by two 2-input NAND circuits 211, 212. The RS flip-flop 210 is arranged such that the output thereof is set when the internal clock starting signal START is brought to the "L" level, and that the output thereof is reset when an internal clock stop signal STOP supplied from the internal clock stop circuit 270 is brought to the "L" level. The gate circuit 220 is formed by an 2-input NAND circuit 221 and an inverter circuit 222. The gate circuit 220 is arranged to supply, as the internal clock signal ICLK, the external clock signal CLK while the output of the RS flip-flop 210 is being set.

The column address counter 230 is arranged to successively increment by 1 the internal column address ICA from the initial address to the final address according to the internal clock signal ICLK. The column address register 240 is arranged to maintain the final address of the internal column address ICA. The address setting circuit 250 is arranged to set, as the initial address ADD0, a column address given as the internal address IADR to the column address counter 230, and also to set, as the final address, an address obtained by subtracting 1 from the initial address ADD0, to the column address register 240. The inversion pulse of the internal clock starting signal START is supplied, as an initial address ADD0 and final address ADD0-1 setting signal SET, to the column address counter 230 and the column address register 240.

The comparing circuit 260 is arranged to compare the least significant two digits A1, A0 of the column address counter 230 with the least significant two digits RA1, RA0 of the column address register 240. The comparing circuit 260 is formed by two XOR circuits 261, 262 and one NAND circuit 263. When the least significant two digits A1, A0 of the column address counter 230 are identical with the least significant two digits RA1, RA0 of the column address register 240, the comparing circuit 260 supplies a judgement signal D in the "L" level. The internal clock stop circuit 270 is arranged to form, from the judgement signal D of the comparing circuit 260, the internal clock stop signal STOP which is in synchronism with the internal clock signal ICLK, and is formed by four inverter circuits 271, 273, 274, 276, one NMOS transistor 272 and one clocked inverter circuit 275.

FIGS. 13(a) to 13(f) are views of signal wave forms illustrating the operation of the timing control circuit 30 in FIG. 12. The internal clock starting signal START is in the "L" level when the /CAS is in the "L" level and the CLK is in the "H" level. More specifically, as shown in FIG. 13(c), the internal clock starting signal START is a pulse signal in the "L" level arranged to fall in synchronism with the rising edge of the external clock signal CLK. When the internal clock starting signal START is brought to the "L" level, the output of the RS flip-flop 210 is set to the "H" level. Thus, as shown in FIG. 13(f), the gate circuit 220 starts supplying the internal clock signal ICLK which is in synchronism with the external clock signal CLK. Further, when the internal clock starting signal START is brought to the "L" level, the NMOS transistor 272 in the internal clock stop circuit 270 becomes conductive. Thus, as shown in FIG. 13(d). the internal clock stop signal STOP is brought to the "H" level. Further, when the internal clock starting signal START is brought to the "L" level, the setting signal SET in the "H" level is supplied to the column address counter 230 and the column address register 240. As a result, the initial address ADD0 and the final address ADD0-1 are set to the column address counter 230 and the column address register 240, respectively. For example, when "00 (binary number)" is set to the least significant two digits A1, A0 of the column address counter 230, the least significant two digits RA1, RA0 of the column address register 240 are set to "11 (binary number)".

Thereafter, the column address register 240 maintains the final address ADD0-1, and the column address counter 230 successively increments by 1, in synchronism with the internal clock signal ICLK, the internal column address ICA from the initial address ADD0. As shown in FIG. 13(e), as the internal column address ICA successively changes from ADD0 to ADD3 through ADD1 and ADD2, the least significant two digits A1, A0 of the column address counter 230 successively change from "00" to "11" through "01" and "10". When the least significant two digits A1, A0 of the column address counter 230 become "11", the judgement signal D of the comparing circuit 260 is changed in level from the "H" level to the "L" level because the equations of A1=RA1 and A0=RA0 are established. When the judgement signal D is brought to the "L" level in the manner above-mentioned, the internal clock stop signal STOP is changed in level from the "H" level to the "L" level in synchronism with the falling edge of the internal clock signal ICLK. When the internal clock stop signal STOP is brought to the "L" level, the output of the RS flip-flop 210 is immediately reset to the "L" level. As a result, the gate circuit 220 stops supplying the internal clock signal ICLK. In the manner above-mentioned, the gate circuit 220 provides the internal clock signal ICLK having pulses in number equal to the data burst length, i.e., four pulses. Simultaneously, the column address counter 230 supplies desired consecutive internal column addresses ICA corresponding to the data burst length.

As thus discussed, in the timing control circuit 30 having the arrangement in FIG. 12, the column address counter 230 originally required for burst transmission of data in the synchronous DRAM, is also used for controlling the termination of the internal clock signal ICLK. Thus, the synchronous DRAM can be reduced in circuit size. Further, the internal clock signal ICLK having pulses only in required number is distributed to a plurality of circuit blocks, i.e., the column decoders 63 of the first and second memory banks 10, 20, the input buffer 53, the output buffer 54 and the like. This considerably lowers the synchronous DRAM in power consumption.

By changing the circuit arrangement of the comparing circuit 260 in FIG. 12, the synchronous DRAM can be applied to an optional data burst length. For example, when the data burst length is equal to 8, it may be judged whether or not the least significant three digits of the column address counter 230 are identical with the least significant three digits of the column address register 240. Dependent on the setting of the final address to the column address register 240, provision may be made such that the judgement signal D is supplied when the address held by the column address counter 230 is not identical in a specific digit with the address held by the column address register 240.

The embodiment above-mentioned is arranged such that the column address counter 230 increments the address. However, provision may be made such that a counter taking the place of the column address counter 230 decrements the address to control the termination of the internal clock signal ICLK. In such an arrangement, the final address to be set to a register taking the place of the column address register 240, is accordingly corrected. Further, to control the termination of the internal clock signal ICLK, there may be disposed a register and a counter each of which holds only digits in number determined by the data burst length.

Further, provision may be made such that, in FIG. 1, the internal clock signal ICLK having pulses in number equal to the data burst length supplied from the timing control circuit 30, is supplied, instead of the internal continuous clock signal ICLK0, to the column redundancy judging circuits 13, 23. In this arrangement, it is not required to enter the internal CAS signal ICAS to the column redundancy judging circuits 13, 23. This may also be applied to the column redundancy judging circuit 190 in FIG. 11.

In the foregoing, the description has been made of the synchronous DRAM according to the embodiment of the present invention. However, the present invention may also be applied to any of a variety of semiconductor memories of the type in and from which data are continuously entered and supplied in synchronism with the external clock signal.

What is claimed is:

1. A semiconductor memory in and from which data are continuously entered and supplied in synchronism with an external clock signal while relieving a localized defect of a memory bank according to a redundancy judgement signal, comprising:

n address comparing circuits in each of which the same defective address relating to said defect of said memory bank, is programmed, to each of which the same address to be successively updated is given in synchronism with said external clock signal, and in which said programmed defective address is successively compared with said given address according to first to nth clock signals each of which has a time period of one cycle n-times the time period of one cycle of said external clock signal and which respectively have different phases from one another, provided that n is an integer not less than 2; and an output circuit for supplying said redundancy judgement signal to be supplied to said memory bank when said defective address becomes identical with said given address in any of said n address comparing circuits.

2. A semiconductor memory in and from which data are continuously entered and supplied in synchronism with an external clock signal while relieving a localized defect of a memory bank according to a redundancy judgement signal, comprising:

a frequency dividing circuit for generating first and second clock signals each of which has a time period of one cycle twice the time period of one cycle of said external clock signal and which have complementary phases;

a first address comparing circuit in which a defective address relating to said defect of said memory bank, is programmed, to which an address to be successively updated for accessing to said memory bank, is given in synchronism with said external clock signal, to which said first clock signal supplied from said frequency dividing circuit is given, which compares said programmed defective address with said given address while said first address comparing circuit is being activated by said first clock signal, and which supplies a first judgement signal when said both addresses become identical with each other;

a second address comparing circuit in which the same defective address as that programmed in said first address comparing circuit, is programmed, to which the same address to be successively updated as that given to said first address comparing circuit, is given in synchronism with said external clock signal, to which said second clock signal supplied from said frequency dividing circuit is given, which compares said programmed defective address with said given address while said second address comparing circuit is being activated by said second clock signal, and which supplies a second judgement signal when said both addresses become identical with each other; and an output circuit for supplying said redundancy judgement signal when either of said first and second judgement signals is obtained.

3. A semiconductor memory according to claim 2, wherein said frequency dividing circuit is arranged such that, according to a given redundancy judging mode setting signal, the operation thereof is switched to supply, to said first and second address comparing circuits, first and second clock signals each having the same time period of one cycle as that of said external clock signal, and said output circuit is arranged such that, according to said redundancy judging mode setting signal, the operation thereof is switched to supply, as said redundancy judgement signal, each of said first and second judgement signals, as they are, respectively supplied from said first and second address comparing circuits, whereby different defective addresses are respectively programmed in said first and second address comparing circuits when said external clock signal is low in frequency.

4. A semiconductor memory according to claim 2, wherein said first address comparing circuit comprises:

a charging transistor interposed between a power source node and a judging node such that said charging transistor is conducted as activated by said first clock signal; and an address comparing unit having series circuits of a plurality of fuse elements to be disconnected according to a defective address to be programmed and a plurality of transistors to be conducted according to an address to be successively updated, said series circuits being disposed between a grounding node and said judging node.

5. A semiconductor memory according to claim 2, wherein said second address comparing circuit comprises:

a charging transistor interposed between a power source node and a judging node such that said charging transistor is conducted as activated by said second clock signal; and an address comparing unit having series circuits of a plurality of fuse elements to be disconnected according to a defective address to be programmed and a plurality of transistors to be conducted according to an address to be successively updated, said series circuits being disposed between a grounding node and said judging node.

6. A semiconductor memory according to claim 2, further comprising a column address counter for supplying, to said first and second address comparing circuits, an internal column address to be successively updated according to a data burst length.

7. A semiconductor memory in and from which data are continuously entered and supplied in synchronism with an external clock signal while relieving localized defects of a plurality of memory banks according to redundancy judgement signals, comprising:

first to nth memory banks to which different addresses are respectively assigned, provided that n is an integer not less than 2, and n address comparing circuits in which defective addresses relating to defects of the corresponding memory bank out of said first to nth memory banks, are respectively programmed, to which the same address to be successively updated, is given in synchronism with said external clock signal, and in which said programmed defective addresses are successively compared with said given address according to first to nth clock signals each of which has a time period of one cycle n-times the time period of one cycle of said external clock signal and which respectively have different phases from one another, such that said redundancy judgement signals are supplied to the corresponding memory bank out of said first to nth memory banks.

8. A semiconductor memory in and from which data are continuously entered and supplied in synchronism with an external clock signal while relieving localized defects of a plurality of memory banks according to redundancy judgement signals, comprising:

a first memory bank to which odd addresses are assigned;

a second memory bank to which even addresses are assigned;

a frequency dividing circuit for generating first and second clock signals each of which has a time period of one cycle twice the time period of one cycle of said external clock signal and which have complementary phases;

a first address comparing circuit in which an odd defective address relating to the defect of said first memory bank, is programmed, to which an address to be successively updated for accessing to said first or second memory banks, is given in synchronism with said external clock signal, to which said first clock signal supplied from said frequency dividing circuit is given, which compares said programmed odd defective address with said given address while said first address comparing circuit is being activated by said first clock signal, and which supplies, as the redundancy judgement signal for said first memory bank, a first judgement signal when said both addresses become identical with each other; and a second address comparing circuit in which an even defective address relating to the defect of said second memory bank, is programmed, to which the same address to be successively updated as that given to said first address comparing circuit, is given in synchronism with said external clock signal, to which said second clock signal supplied from said frequency dividing circuit is given, which compares said programmed even defective address with said given address while said second address comparing circuit is being activated by said second clock signal, and which supplies, as the redundancy judgement signal for said second memory bank, a second judgement signal when said both addresses become identical with each other.

9. A semiconductor memory according to claim 8, wherein said first address comparing circuit comprises:

a charging transistor interposed between a power source node and a judging node such that said charging transistor is conducted as activated by said first clock signal; and an address comparing unit having series circuits of a plurality of fuse elements to be disconnected according to an odd defective address to be programmed and a plurality of transistors to be conducted according to an address to be successively updated, said series circuits being disposed between a grounding node and said judging node.

10. A semiconductor memory according to claim 8, wherein said second address comparing circuit comprises:

a charging transistor interposed between a power source node and a judging node such that said charging transistor is conducted as activated by said second clock signal; and an address comparing unit having series circuits of a plurality of fuse elements to be disconnected according to an even defective address to be programmed and a plurality of transistors to be conducted according to an address to be successively updated, said series circuits being disposed between a grounding node and said judging node.

11. A semiconductor memory according to claim 8, further comprising a column address counter for supplying, to said first and second address comparing circuits, an internal column address to be successively updated according to a data burst length.

\* \* \* \* \*